United States Patent
Camillo-Castillo et al.

(10) Patent No.: US 10,153,361 B2
(45) Date of Patent: Dec. 11, 2018

(54) HETEROJUNCTION BIPOLAR TRANSISTOR DEVICE INTEGRATION SCHEMES ON A SAME WAFER

(71) Applicant: GLOBALFOUNDRIES INC., Grand Cayman (KY)

(72) Inventors: Renata A. Camillo-Castillo, Williston, VT (US); Vibhor Jain, Essex Junction, VT (US); Qizhi Liu, Lexington, MA (US); Anthony K. Stamper, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/360,295

(22) Filed: Nov. 23, 2016

(65) Prior Publication Data

US 2018/0145160 A1   May 24, 2018

(51) Int. Cl.
| | | |
|---|---|---|
| *H01L 29/737* | (2006.01) | |
| *H01L 21/8222* | (2006.01) | |
| *H01L 21/02* | (2006.01) | |
| *H01L 21/268* | (2006.01) | |
| *H01L 21/324* | (2006.01) | |
| *H01L 27/082* | (2006.01) | |

(Continued)

(52) U.S. Cl.
CPC .... *H01L 29/7375* (2013.01); *H01L 21/02532* (2013.01); *H01L 21/02592* (2013.01); *H01L 21/02675* (2013.01); *H01L 21/268* (2013.01); *H01L 21/324* (2013.01); *H01L 21/8222* (2013.01); *H01L 27/0823* (2013.01); *H01L 27/0825* (2013.01); *H01L 29/04* (2013.01); *H01L 29/0649* (2013.01); *H01L 29/0653* (2013.01); *H01L 29/16* (2013.01); *H01L 29/161* (2013.01); *H01L 29/167* (2013.01); *H01L 29/66242* (2013.01); *H01L 29/7371* (2013.01); *H03F 3/21* (2013.01); *H03F 2200/294* (2013.01)

(58) Field of Classification Search
CPC .......... H01L 29/7375; H01L 21/02532; H01L 21/02592; H01L 21/02675; H01L 21/268
See application file for complete search history.

(56) References Cited

U.S. PATENT DOCUMENTS

| | | |
|---|---|---|
| 6,355,544 B1 | 3/2002 | Essaian et al. |
| 8,450,179 B2 | 5/2013 | El-Kareh et al. |

(Continued)

OTHER PUBLICATIONS

Tawinese Office Action in related Tawinese Application No. 106105271 dated Nov. 3, 2017, 17 pages.

(Continued)

*Primary Examiner* — Bradley K Smith
(74) *Attorney, Agent, or Firm* — Michael Le Strange; Andrew M. Calderon; Roberts Mlotkowski Safran Cole & Calderon, P.C.

(57) ABSTRACT

The present disclosure generally relates to semiconductor structures and, more particularly, to heterojunction bipolar transistor device integration schemes on a same wafer and methods of manufacture. The structure includes: a power amplifier (PA) device comprising a base, a collector and an emitter on a wafer; and a low-noise amplifier (LNA) device comprising a base, a collector and an emitter on the wafer, with the emitter having a same crystalline structure as the base.

20 Claims, 4 Drawing Sheets

(51) Int. Cl.
*H01L 29/04* (2006.01)
*H01L 29/06* (2006.01)
*H01L 29/16* (2006.01)
*H01L 29/161* (2006.01)
*H01L 29/167* (2006.01)
*H01L 29/66* (2006.01)
*H03F 3/21* (2006.01)

(56) References Cited

U.S. PATENT DOCUMENTS

| | | |
|---|---|---|
| 8,603,885 B2 | 12/2013 | Malladi et al. |
| 2002/0192914 A1 | 12/2002 | Kizilyalli et al. |
| 2012/0074465 A1 | 3/2012 | Chen et al. |
| 2012/0322323 A1 | 12/2012 | Fowler |
| 2013/0210210 A1 | 8/2013 | Gluschenkov et al. |
| 2014/0151750 A1* | 6/2014 | Camillo-Castillo ......... H01L 29/7378 257/197 |
| 2017/0365695 A1* | 12/2017 | Jain ................ H01L 29/7378 |

OTHER PUBLICATIONS

Asbeck, "Bipolar Transistors", Modern Semiconductor Device Physics edited by S.M. Sze, 1998, pp. 3.

Application and Drawings for U.S. Appl. No. 14/965,267, filed Dec. 10, 2015, 25 pages.

Camillo-Castillo et al., "SiGe HBTs in 90nm BiCMOS technology demonstrating 300GHz/420GHz fT/fMAX through reduced Rb and Ccb parasitics", IEEE, Sep. 2013, 4 pages.

Germany Notice of Allowance in related Germany Application No. 10 2017 202 302.3 dated Nov. 8, 2017, 5 pages.

Abseck, "Bipolar Transistor", Modem Semiconductor Device Physics, 1998, 3 pages.

Taiwanese Office Acton in related Taiwanese Application No. 106105271 dated May 23, 2018, 19 pages.

* cited by examiner

HETEROJUNCTION BIPOLAR TRANSISTOR DEVICE INTEGRATION SCHEMES ON A SAME WAFER

FIELD OF THE INVENTION

The present disclosure generally relates to semiconductor structures and, more particularly, to heterojunction bipolar transistor device integration schemes on a same wafer and methods of manufacture.

BACKGROUND

Certain applications, such as computing and wireless communication devices, require bipolar complementary metal-oxide semiconductor (BiCMOS) integrated circuits. These applications require a low-noise amplifier (LNA) device and a power amplifier (PA) device, e.g., SiGe heterojunction bipolar transistors (HBTs) integrated on the same wafer.

However, the LNA device and the PA device can have different performance and optimization requirements. For example, the LNA device may require a relatively high beta, a relatively high short circuit current gain cut-off frequency (fT) and a relatively low base resistor ($R_b$). On the other hand, the PA device may require a relatively low base emitter capacitance ($C_{be}$) and a relatively high breakdown voltage ($BV_{ceo}$) (nominal Beta).

It is possible to have the LNA device and the PA device HBTs share a same base profile. However, in such an approach only one device can be optimized for performance while the other device is optimized for the given base profile using either extra implants or layouts.

SUMMARY

In an aspect of the disclosure a structure comprises: a power amplifier (PA) device comprising a base, a collector and an emitter on a wafer; and a low-noise amplifier (LNA) device comprising a base, a collector and an emitter on the wafer, with the emitter having a same crystalline structure as the base.

In an aspect of the disclosure a structure comprises: a power amplifier (PA) device having a base, an emitter and a collector region; and a low-noise amplifier (LNA) and comprising a base, an emitter and a collector region, the base of the LNA comprising a different crystalline structure than the base of the PA device.

In an aspect of the disclosure a method comprises: forming a power amplifier (PA) device on a wafer; forming a low-noise amplifier (LNA) device adjacent to the PA device on the same wafer using same material layers and etching processes as the PA device; forming an amorphous material over the LNA device while protecting the PA device; annealing the amorphous material over the LNA device; and recrystallizing the amorphous material of the LNA device such that an emitter and base of the LNA device will have a same crystalline structure

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
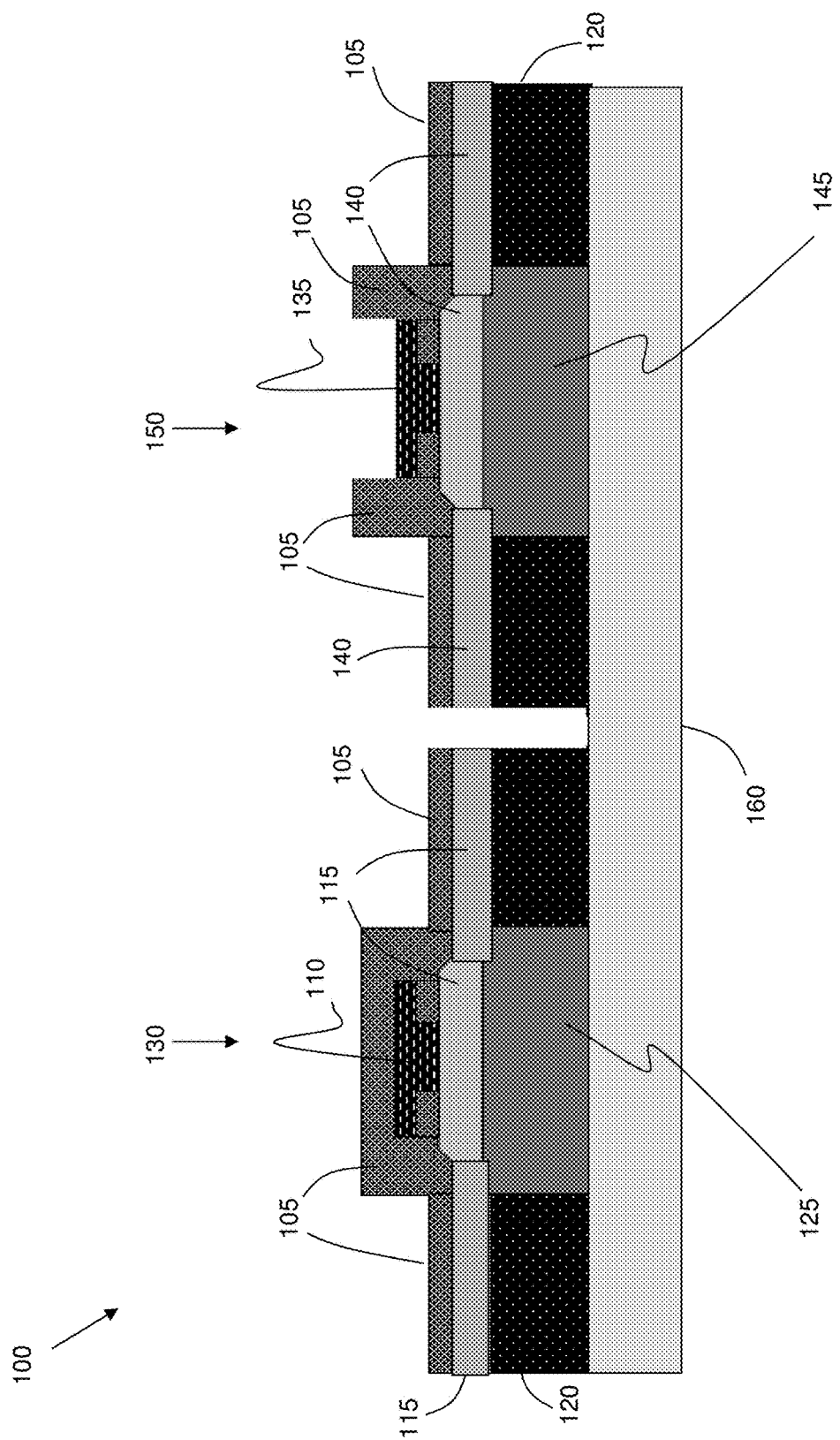
FIG. 1 shows heterojunction bipolar transistors (HBTs) (e.g., a power amplifier (PA) device and a low-noise amplifier (LNA) device) integrated on a same wafer and respective fabrication processes in accordance with aspects of the present disclosure.

The disclosure generally relates to semiconductor structures and, more particularly, to multiple heterojunction bipolar transistor (HBT) device integration schemes on a same wafer and methods of manufacture. In more specific embodiments, the HBT device integration includes a selective melt process for one of the HBTs, e.g., low-noise amplifier (LNA) device. For example, in specific aspects of the disclosure, a selective melt laser annealing process of a LNA device in conjunction with extra implant(s) is provided to meet both LNA device and power amplifier (PA) device requirements on the same wafer. In embodiments, a pre-amorphization implant can also be applied to an emitter structure of a LNA device; however, the pre-amorphization implant is not applied to the PA device.

In embodiments, two different HBTs can be formed on a same wafer with different emitter and/or base formation processes to optimize performance of both the PA device and LNA device. For example, in embodiments, an emitter pre-amorphization implant t together with a laser melt can be used to tune the electrical properties of the LNA device. In further embodiments, it is contemplated to pre-amorphize an emitter of the HBT and then utilize a laser melt process to tune electrical properties of the PA and LNA devices. Further, the methods described herein independently tune the emitter resistance and beta of HBTs in the same process on the same wafer. Also, the methods described herein independently tune and control the emitter-base (E-B) capacitance of the LNA device, and/or independently tune the base resistance of the LNA devices in the same process on the same wafer.

In embodiments, the selective laser annealing can be applied to the entire wafer. Under this approach, emitters of amorphous material can melt for a relatively high enough laser fluency at a temperature lower than crystalline silicon. In further embodiments, the selective laser annealing can also be applied selectively to the LNA device without impacting the PA device. Additionally, in these further embodiments, only the amorphous silicon (a-Si) is melted without effecting, i.e., melting the poly-Si or single crystal Si of the emitter of the PA device. In embodiments, the selective laser annealing, i.e., melt, can redistribute arsenic (As) and increase the As emitter activation, which can increase beta for the LNA device. This redistribution will not occur on the PA device as it would lower collector to emitter breakdown voltage ($BV_{ceo}$). Further, this laser annealing can also reduce emitter resistance which helps in improving fT.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

FIG. 1 shows a structure and respective fabrication processes in accordance with aspects of the present disclosure. More specifically, FIG. 1. shows a structure 100 comprising a power amplifier (PA) device 130 and a low-noise amplifier (LNA) device 150, e.g., heterojunction bipolar transistors (HBTs). The PA device 130 and the LNA device 150 can be formed together on a chip composed of any suitable semiconductor wafer material 160, e.g., Si, although other materials are contemplated herein, on which a given functional circuit is fabricated. The HBTs 100 can be made by a conventional complementary metal-oxide-semiconductor (CMOS) build, for example.

Still referring to FIG. 1, the structure 100 includes shallow trench isolation (STI) structures 120 to isolate the PA device 130 and the LNA device 150. The STI structures 120 can be made of any suitable insulator material, e.g., $SiO_2$ material, among other suitable examples. As shown in FIG. 1, the STI structures 120 can be formed adjacent to both the PA device 130 and the LNA device 150, using conventional lithography, etching and deposition processes known to those having ordinary skill in the art.

In embodiments, the PA device 130 includes an emitter 110, a base 115 and a collector 125, all of which are formed by conventional CMOS processes, e.g., deposition of materials and subsequent patterning of materials using lithography and etching processes. The emitter 110 can be comprised from a poly silicon (poly-Si) or a single crystal silicon. The emitter 110 also includes n-type dopants. Examples of these emitter n-type dopants include Arsenic (As), Phosphorus (P) and Sb, among other suitable examples. The base 115 can be composed of a silicon or silicon-germanium (SiGe) material, among other suitable examples. The collector 125 can be composed of a bulk silicon or a silicon-on-insulator (SOI) material.

The LNA device 150 also includes an emitter 135, a base 140 and a collector 145, composed of the same materials as the PA device 130. In embodiments, the emitter 135, the base 140, and the collector 145 are formed at the same time, in the same processes as the emitter 110, the base 115 and the collector 125 of the PA device 130. Further, because of subsequent implantation and annealing processes, the emitter 110 can be formed as a poly-crystalline emitter and emitter 135 can be formed as a single crystal emitter or vice versa. That is, due to the processes provided herein, the emitter 110 can have the same crystalline structure as the underlying base material, e.g., base 115. For example, after the pre-amorphization implant (PAI), laser anneal melt and cool down processes, the emitter can recrystallize such that the LNA device 150 can have a single crystal emitter which may be Si or SiGe, while the PA device 130 only has a poly-Si emitter.

In embodiments, the base 115 and the base 140 can be a p-doped intrinsic base over the collector (Si) regions 125, 145, respectively. The portion of the base 115, 140 over the collector region will be a single crystal; whereas, the extrinsic base portion over the STI regions 115 is deposited as a polycrystalline. More specifically, as one of skill in the art would understanding, when a p-doped base material is deposited, it will grow as single crystal over silicon and poly-crystalline over the STI.

Still referring to FIG. 1, a dielectric layer 105 covers the LNA device 150 and the PA device 130, formed by conventional deposition methods, e.g., chemical vapor deposition (CVD). The dielectric layer 105 can be selectively removed to expose certain areas of the LNA device 150. For example, as shown in FIG. 1, the dielectric layer 105 covering the emitter 135 of the LNA device 150 can be removed by an etching process, e.g., reactive ion etching (RIE), to expose the emitter 135. More specifically, a photoresist is formed on the dielectric layer 105, followed by exposure to energy (light) to form an opening over the emitter 135. A reactive-ion etching (RIE) process is then performed to remove the dielectric layer 105 to expose the emitter 135. The resist is then removed by a conventional stripant or oxygen ashing.

Figure 2:
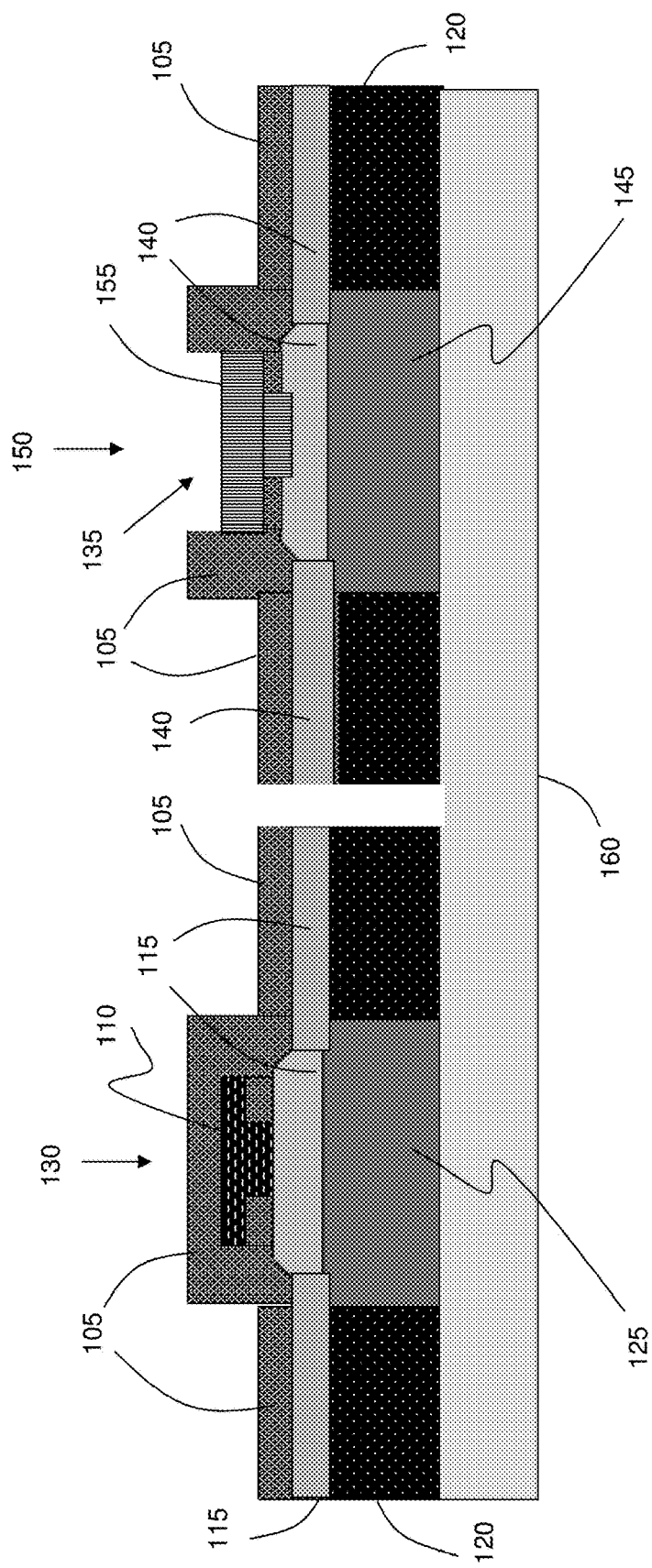
FIG. 2 shows the HBTs integrated on the same wafer with the LNA device comprising an amorphous material and respective fabrication processes in accordance with aspects of the present disclosure.

In FIG. 2, an implant is added to the emitter 135 of the LNA device 150 to form an amorphous material 155. The implant can be germanium (Ge) or other suitable materials. For example, the implant can be As, P and Sb, in combination with Ge. These additional implants can increase the n+ concentration in the emitter 135 so that, in embodiments the emitter 135 can have a higher n-type dopant concentration than the emitter 110. In embodiments, the dielectric layer 105 over the PA device 130 can be used to prevent implants or dopants from being implanted on the PA device 130.

In embodiments, the implant can be a pre-amorphization implant (PAI) to amorphize the silicon of the emitter 135, forming the amorphous material 155. The PAI can have an energy of about 40 kiloelectron volt (KEV), with a total implant dose of about 1 E15. If the implant contains As, the As can amorphize for a sufficiently high dose. As should be understood, the amorphization of the emitter 135 can redistribute the As and increase the As emitter activation, which can increase the beta for the LNA device 150. As is known, higher beta for the LNA device improves a noise figure (NF). However, as the PA device 130 remains blocked by the dielectric layer 105, it will not be affected by this implant process which could otherwise lower its breakdown voltage collector to emitter (BVceo).

In further embodiments, the implant can be of another species, e.g., Ge PAI only or Ge PAI plus an additional As/P/Sb, depending on the thickness of the emitter 135. In this way, this implant process can be tunable to have dopants in an upper ½ to ⅓ region of the emitter 135, for example. In any scenario, a dielectric layer 105 over the emitter 135 is removed so that implantation of the implant can occur. During the implantation processes, the thickness of the dielectric layer 105 will prevent the implant from affecting other regions of the HBT 100, e.g., PA device 130.

Figure 3:
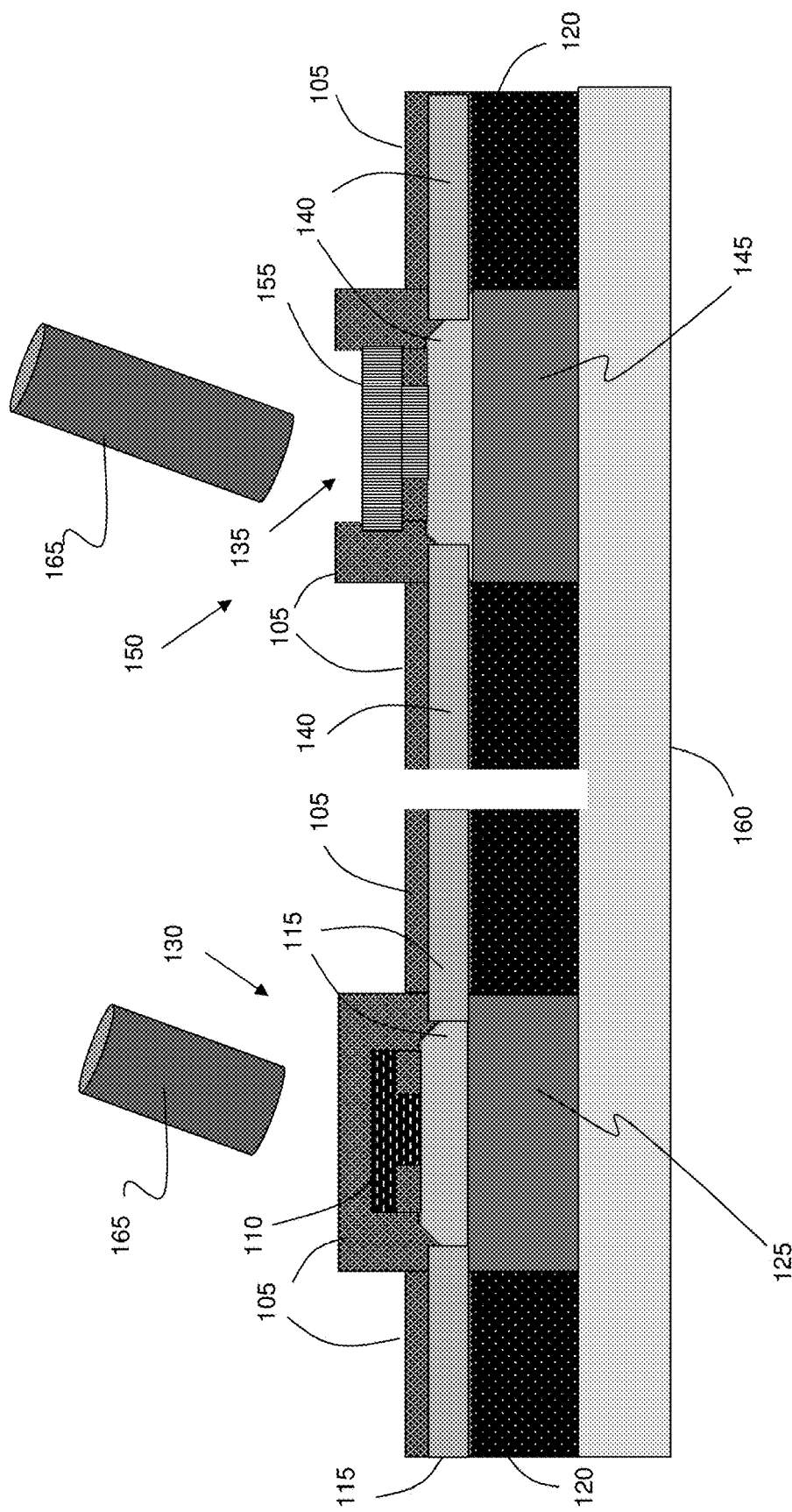
FIG. 3 shows the HBTs with a melted amorphous material for the LNA device and respective fabrication processes in accordance with aspects of the present disclosure.

FIG. 3 shows a selective laser annealing (LSA) technique using a laser 165. In embodiments, the laser 165 will selectively anneal the exposed amorphous material 155. For example, in embodiments, the laser 165 can be focused only on the amorphous material 155, or can laser anneal the entire structure 100, with the dielectric layer 105 protecting layers of the PA device 130. The temperature of the laser 165 is selected to anneal, e.g., melt, the amorphous material 155, such as an a-silicon region. For example, the temperature of the laser 165 can be in a range of about 250° C. to 1414° C., with a preference of about 800-1000° C. Once the amorphous material 155 melts it can recrystallize upon removal of the laser anneal source. With the application of the LSA technique, the dopant will redistribute evenly in the amorphous material 155, hence resulting in a recrystallization of the emitter 135 to match the crystalline structure of the underlying material of the base 140.

As shown in FIG. 3, the laser 165 is applied to both the PA device 130 and the LNA device 150. A Polycrystalline or single crystal material of 110 emitter of the PA device 130 does not melt due to insufficient heat from the laser beam emitted from the laser 165. On the other hand, the laser beam from the laser 165 will be emitting directly on the emitter 135, and specifically the amorphous material 155. This allows for the amorphous material 155 to melt. Upon cooling, the amorphous emitter material 155 recrystallizes with a redistributed doping profile, thus resulting in a tunable emitter 135 (which would have the same crystalline structure as the underlying material).

By implanting the emitter 135 and then melting the resultant amorphous material 155, the gain of the emitter 135 can be tuned. However, the gain of the emitter 110 is not affected as significantly as the emitter 135 since the emitter 110 does not melt. However, an extra thermal cycle from the laser beam might impact the dopant activation in the emitter 110, thereby shifting device beta. Accordingly, in this way the gain of the emitter 110 and the gain of the emitter 135 can be tuned differently. Additionally, the emitter 135 can have an increased beta and also a reduced emitter resistance, which can improve if. However, an increased beta is not desirable from a PA device perspective as it lowers the BVceo.

Moreover, since there is no melting in the PA device 130, the dopants in the emitter 110 will also have a different distribution compared to the emitter 135 of the LNA device 150. Accordingly, due to this selective annealing, the emitter junction 110 of the PA device 130 and the emitter junction of 135 the LNA device 150 can be tuned different. In this way, the PA device 130 and the LNA device 150 can be tuned independently, and both the PA device 130 and the LNA device 150 can be optimized. For example, by implementing the processes described herein, the LNA device 150 can have a higher current gain beta. Laser annealing also helps in improving the dopant activation in the base of the LNA device 150, thereby reducing base resistance. Higher Beta and lower RB result in an improved a noise figure (NF), resulting in a lower noise profile for the LNA device 150.

Still referring to FIG. 3, the selective annealing can also be used to independently modulate the Arsenic diffusion of the emitter 135. This allows control of the emitter-base (E-B) junction location required for an optimized LNA performance of the LNA device 150. Additionally, the annealing can allow for thicker Emitter-Intrinsic layers for the PA device 130, resulting in a reduced base-emitter (B-E) junction capacitance (Cbe) and improved beta control.

Figure 4:
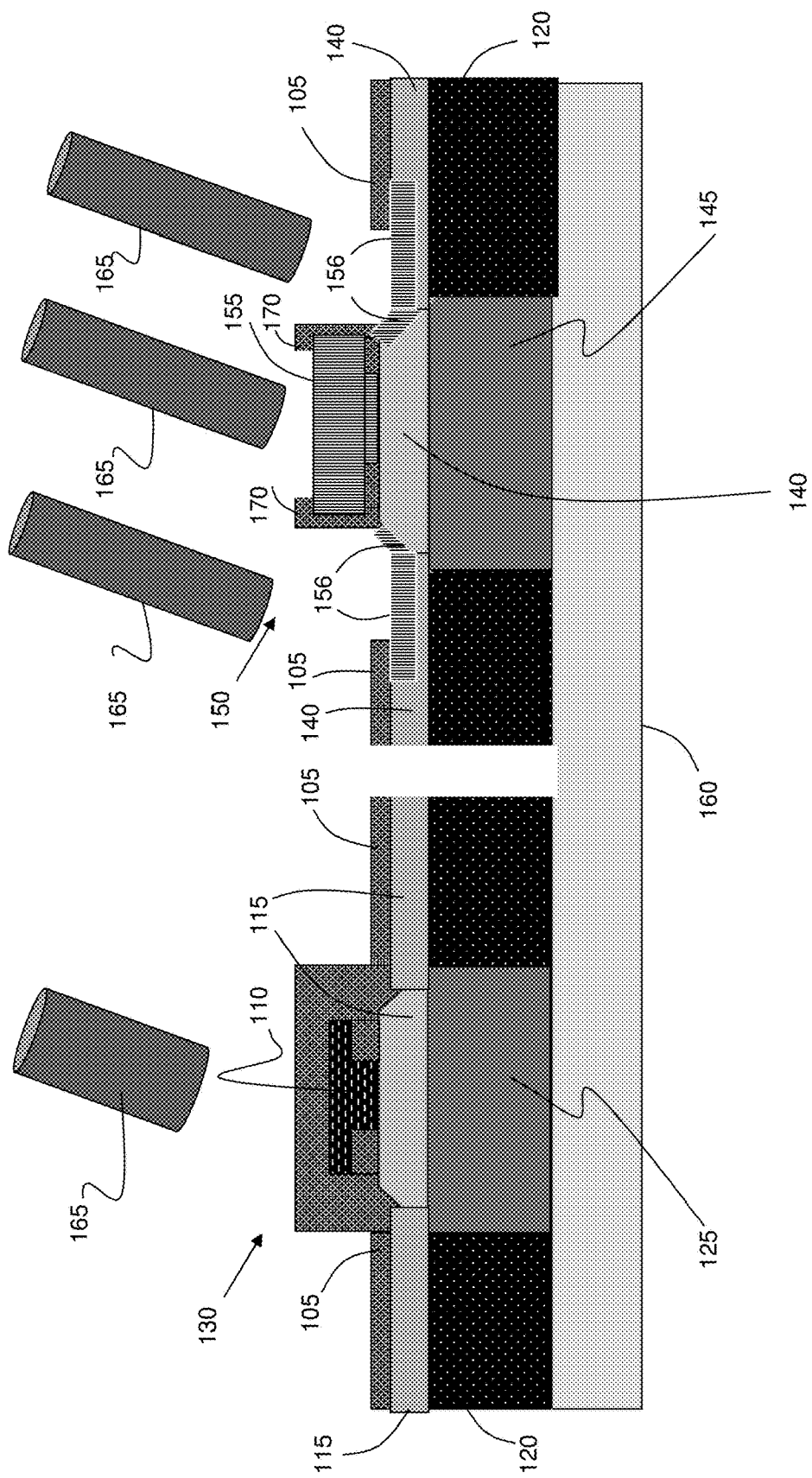
FIG. 4 shows alternative HBTs with amorphous materials and respective fabrication processes in accordance with aspects of the present disclosure.

Referring to FIG. 4, the base 140 of the LNA device 150 can also be exposed (in addition to the emitter 135) to the annealing (melting) process. Similar to the etching processes described for FIG. 1, the dielectric layer 105 covering the emitter 135 of the LNA device 150 can be removed, exposing the emitter 135. The etching process can include an isotropic etching to remove sidewalls of the base 140, while leaving spacers 170 which separate the emitter 135 from the base 140. In embodiments, the spacer 170 will protect the junction between the emitter 135 and the base 140 during subsequent processes, e.g., annealing. A pre-amorphization implant (PAI) of Ge (or other species) can be applied to the emitter 135 to form the amorphous material 155 and the base 140 to form the amorphous material 156, respectively. That is, the PAI can also amorphize the silicon of the base 140 to form the amorphous material 156 illustrated in FIG. 4. In contrast to the processes described in FIG. 2, no subsequent dopant implant is required in this aspect of the disclosure.

Referring still to FIG. 4, the amorphous materials 155 and 156 will be selectively melted with selective laser annealing (LSA) techniques using the lasers 165. Once the amorphous materials 155 and 156 melt, the amorphous materials 155 and 156 will recrystallize on removal of the laser anneal source, resulting in a recrystallization of the emitter 135 and portions of the base 140. By melting the amorphous materials 155 and 156, a lower base resistance ($R_b$) of base 140 and a lower emitter resistance ($R_e$) can be achieved due to an improved dopant activation in the amorphous materials 155 and 156. In embodiments, the laser 165 will affect only the amorphous materials 155 and 156, while the dielectric layer 105 will protect remaining portions of the HBT 100. It is contemplated that after the amorphous material 156 melts, during recrystallization, the amorphous material 156 will become either a poly crystalline or a single crystal matching the same structure as the intrinsic base 140 due to contact with the poly crystalline or single crystal intrinsic base region 140.

In any aspect described herein, the lasers 165 of the LSA technique can implement a laser beam spot size of 2×2 um, and a position accuracy of about 0.3 um. Additionally, the LSA technique is desirable over the use of an extra implant and conventional rapid thermal anneal (RTA). As should be understood, RTA will prevent fast enough ramp rates to enable a rapid linear polarization extinction ratio (LPER), resulting in significant diffusion. In comparison, the LSA technique can enable rapid LPER and lock atoms into position relatively quickly.

Further, the LSA annealing technique can be applied to the entire wafer, or alternatively only melt the amorphous silicon (a-Si) without effecting, i.e., melting the poly-Si or single crystal Si of the emitter 135. In alternative embodiments, the LNA devices 150 can be locally annealed. Additionally, multiple LNA devices 150 can be aligned for easier raster scan of the laser. Additionally, pre-amorphization and recrystallization of the base ($X_b$) 140 can occur along with the emitter 135.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a power amplifier (PA) device comprising a first base, a first collector and a first emitter on a wafer; and
   a low-noise amplifier (LNA) device comprising a second base, a second collector and a second emitter on the wafer, with the second emitter having a same crystalline structure as the second base, wherein the first emitter of the PA device and the second base of the LNA device have different crystal structures.

2. The structure of claim 1, wherein the first base is a SiGe material or a Si material.

3. The structure of claim 1, wherein the first emitter is a doped and annealed material.

4. The structure of claim 1, wherein the second emitter and the second base are a single crystalline structure.

5. The structure of claim 1, wherein the second emitter of the LNA device includes n-type dopants in a higher concentration than an n-type dopant concentration of the first emitter of the PA device.

6. The structure of claim 5, wherein the n-type dopants are distributed evenly for the LNA device.

7. The structure of claim 5, wherein the n-type dopants include one of As, P and Sb.

8. The structure of claim 1, wherein the second emitter of the LNA device has a reduced resistance with respect to the first emitter of the PA device.

9. The structure of claim 1, wherein the second emitter of the LNA device is a recrystallized semiconductor.

10. The structure of claim 1, wherein a gain of the first emitter of the PA device is tuned differently than a gain of the second emitter of the LNA device.

11. The structure of claim 10, wherein the first emitter of the PA device comprises n-type dopants in a different distribution compared to n-type dopants in the second emitter of the LNA device.

12. The structure of claim 11, wherein the PA device and the LNA device can be tuned independently.

13. The structure of claim 12, wherein the LNA device has a lower noise profile than the PA device.

14. A structure comprising:
    a power amplifier (PA) device having a first base, a first emitter and a first collector region; and
    a low-noise amplifier (LNA) comprising a second base, a second emitter and a second collector region, the second base of the LNA comprising a different crystalline structure than the first base of the PA device.

15. The structure of claim 14, wherein the second emitter of the LNA device has a reduced resistance with respect to the first emitter of the PA device.

16. The structure of claim 14, wherein the second emitter of the LNA device includes n-type dopants in a higher concentration than an n-type dopant concentration of the first emitter of the PA device.

17. The structure of claim 16, wherein the second emitter of the LNA device has a same crystalline structure as the second base of the LNA device.

18. The structure of claim 17, wherein the second emitter of the LNA device is composed of SiGe or Si doped material.

19. The structure of claim 14, wherein the PA device has a thicker emitter-intrinsic layer than the LNA device.

20. The structure of claim 14, further comprising a recrystallized extrinsic base layer over STI regions.

* * * * *